United States Patent
Sato et al.

(10) Patent No.: US 8,721,820 B2
(45) Date of Patent: May 13, 2014

(54) METHOD FOR MANUFACTURING MULTILAYER CERAMIC ELECTRONIC COMPONENT

(75) Inventors: Koji Sato, Nagaokakyo (JP); Yukio Sanada, Nagaokakyo (JP); Yasuhiro Nishisaka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/602,354

(22) Filed: Sep. 4, 2012

(65) Prior Publication Data

US 2013/0056133 A1 Mar. 7, 2013

(30) Foreign Application Priority Data

Sep. 5, 2011 (JP) ................. 2011-192358
May 23, 2012 (JP) ................. 2012-117712

(51) Int. Cl.
*C03B 29/00* (2006.01)
*H01G 4/20* (2006.01)
*H01G 4/06* (2006.01)
*H01G 4/228* (2006.01)

(52) U.S. Cl.
USPC .......... 156/89.12; 156/89.16; 361/321.1; 361/321.2; 361/311; 361/312; 361/313; 361/306.1; 361/306.3

(58) Field of Classification Search
USPC ............ 156/89.12, 89.16; 361/321.1, 321.2, 361/311, 312, 313, 306.1, 306.3
See application file for complete search history.

(56) References Cited

U.S. PATENT DOCUMENTS

| | | | |
|---|---|---|---|
| 6,381,118 B1 * | 4/2002 | Yokoyama et al. | 361/308.1 |
| 7,324,325 B2 * | 1/2008 | Kojima et al. | 361/311 |
| 7,867,349 B2 * | 1/2011 | Tonogai et al. | 156/89.12 |
| 2009/0211687 A1 * | 8/2009 | Iguchi et al. | 156/60 |
| 2010/0118467 A1 * | 5/2010 | Takeuchi et al. | 361/306.3 |
| 2010/0123994 A1 | 5/2010 | Nishisaka et al. | |
| 2011/0293894 A1 | 12/2011 | Sato et al. | |
| 2012/0018205 A1 | 1/2012 | Sato et al. | |

FOREIGN PATENT DOCUMENTS

| | | |
|---|---|---|
| JP | 2000-353636 A | 12/2000 |
| JP | 2010-141300 A | 6/2010 |
| JP | 2011-253895 A | 12/2011 |
| JP | 2012-028456 A | 2/2012 |

OTHER PUBLICATIONS

ScienceLab.com, "Dioctyl Phthalate MSDS".*
Sckisui, "S-LEC B".*
Sckisui, "S-LEC B MSDS".*

* cited by examiner

*Primary Examiner* — Philip Tucker
*Assistant Examiner* — Alex Efta
(74) *Attorney, Agent, or Firm* — Keating & Bennett, LLP

(57) ABSTRACT

A method for manufacturing a multilayer ceramic electronic component significantly reduces and prevents swelling or distortion when a conductive paste is applied to a green ceramic element body. A ceramic green sheet used in the method satisfies 180.56≤A/B wherein A is a polymerization degree of an organic binder contained in the ceramic green sheet, and B is a volume content of a plasticizer contained in the ceramic green sheet.

7 Claims, 9 Drawing Sheets

FIG. 2                    20b

METHOD FOR MANUFACTURING MULTILAYER CERAMIC ELECTRONIC COMPONENT

BACKGROUND OF THE INVENTION

1. Field of the Invention

The present invention relates to a method for manufacturing a multilayer ceramic electronic component.

2. Description of the Related Art

In recent years, along with reduction in size and thickness of electronic apparatuses such as a cellular phone, a portable music player, and other such apparatuses, for example, reduction in size and thickness of multilayer ceramics to be mounted on the electronic apparatuses has been advanced. A process for manufacturing such multilayer ceramic electronic components includes applying a conductive paste to a surface of a green ceramic element body and then baking the paste to form an external electrode (see, for example, Japanese Unexamined Patent Application Publication No. 2010-141300).

However, when the conductive paste is applied to a surface of the green ceramic element body, a solvent or other similar material contained in the conductive paste penetrates into the green ceramic element body, thereby causing the problem of swelling or distorting of the green ceramic element body.

SUMMARY OF THE INVENTION

Accordingly, preferred embodiments of the present invention provide a method for manufacturing a multilayer ceramic electronic component that significantly reduces and prevents the occurrence of swelling or distortion when a conductive paste is applied to a green ceramic element body.

According to a preferred embodiment of the present invention, a method for manufacturing a multilayer ceramic electronic component includes preparing a first ceramic green sheet, a conductive layer being formed on a surface thereof in order to form an internal electrode and a second ceramic green sheet, a conductive layer being not formed on a surface thereof in order to form an internal electrode; laminating at least one second ceramic green sheet, a plurality of the first ceramic green sheets, and at least one second ceramic green sheet in this order to form a green ceramic element body including main surfaces and end surfaces in which the conductive layers are exposed; applying a conductive paste to at least the main surface to form a conductive paste layer for forming an external electrode; and firing the green ceramic element body having the conductive paste layer formed thereon to manufacture a multilayer ceramic electronic component. Each of the first and second ceramic green sheets contains an organic binder and a plasticizer. The second ceramic green sheets constituting the main surfaces satisfy $180.56 \leq A/B$ wherein A is the polymerization degree of the organic binder, and B is the volume content, in other words, the percentage by volume of the plasticizer. In the step of forming the green ceramic element body, preferably a plurality of the second ceramic green sheets, a plurality of the first ceramic green sheets, and a plurality of the second ceramic green sheets are laminated in this order, and each of the plurality of the second ceramic green sheets satisfies $180.56 \leq A/B$, for example.

In a specified aspect of a preferred embodiment of the present invention, in the method for manufacturing a multilayer ceramic electronic component, the second ceramic green sheet constituting the main surface preferably satisfies $2.74 \leq ((A/B)/(A1/B1)) \leq 5.00$ wherein A1 is the polymerization degree of the organic binder contained in the first ceramic green sheet, and B1 the volume content of the plasticizer contained in the first ceramic green sheet. In the step of forming the green ceramic element body, preferably a plurality of the second ceramic green sheets, a plurality of the first ceramic green sheets, and a plurality of the second ceramic green sheets are laminated in this order, and each of the plurality of the second ceramic green sheets satisfies $2.74 \leq ((A/B)/(A1/B1)) \leq 5.00$.

In another specified aspect of a preferred embodiment of the present invention, in the method for manufacturing a multilayer ceramic electronic component, the organic binder contained in each of the first and second ceramic green sheets is at least one selected from the group consisting of polyvinyl butyral resins, polyvinyl formal resins, and polyvinyl hexanal resins, for example.

In a further specified aspect of a preferred embodiment the present invention, in the method for manufacturing a multilayer ceramic electronic component, the plasticizer contained in each of the first and second ceramic green sheets preferably is a phthalate.

According to various preferred embodiments of the present invention, it is possible to provide a method for manufacturing a multilayer ceramic electronic component capable of significantly reducing and preventing the occurrence of swelling or distortion when a conductive paste is applied to a green ceramic element body.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
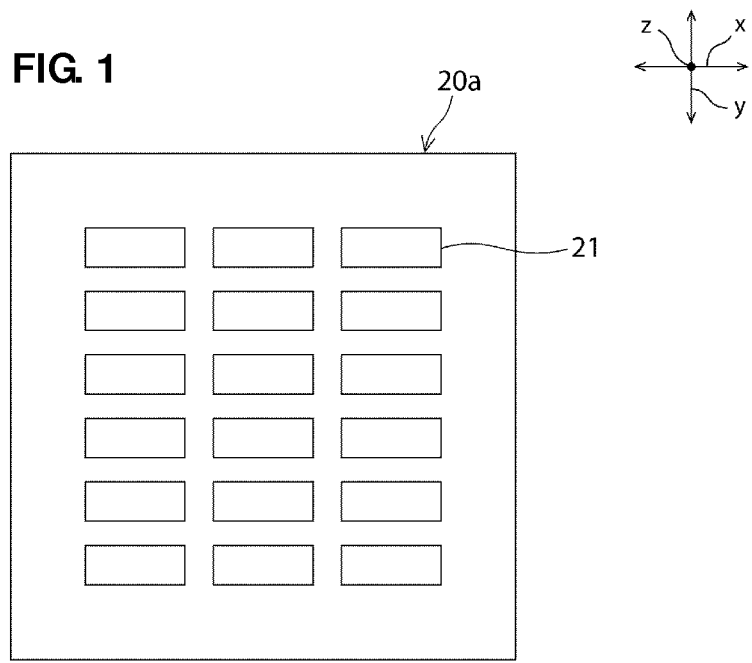
FIG. 1 is a schematic plan view of a ceramic green sheet having conductive layers formed on a surface thereof according to a preferred embodiment of the present invention.

Preferred embodiments of the present invention are described below. However, the preferred embodiments described below are only illustrative, and the present invention is not limited to the preferred embodiments described herein.

In the drawings illustrating various preferred embodiments of the present invention, members having substantially the same function are denoted by the same reference numeral. In addition, the drawings illustrating various preferred embodiments of the present invention are schematic drawings, and the dimensional ratios of substances shown in the drawings may be different from those of actual substances. Also, the dimensional ratios of substances may be different between the drawings. The specific dimensional ratios of substances, etc. should be determined in consideration of the description below.

Figure 2:
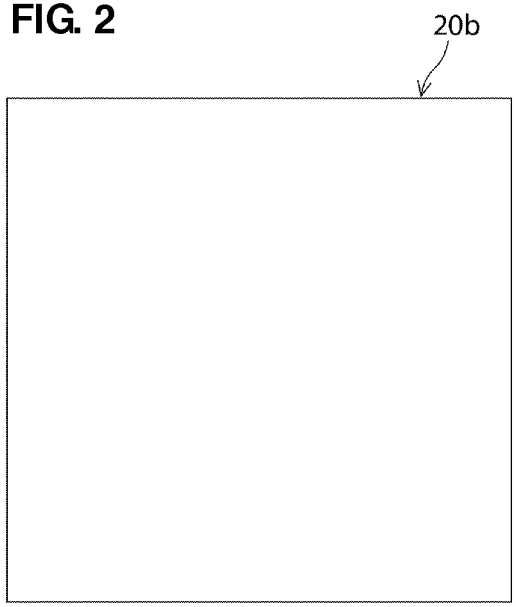
FIG. 2 is a schematic plan view of a ceramic green sheet not having conductive layers formed on a surface thereof according to a preferred embodiment of the present invention.
Figure 3:
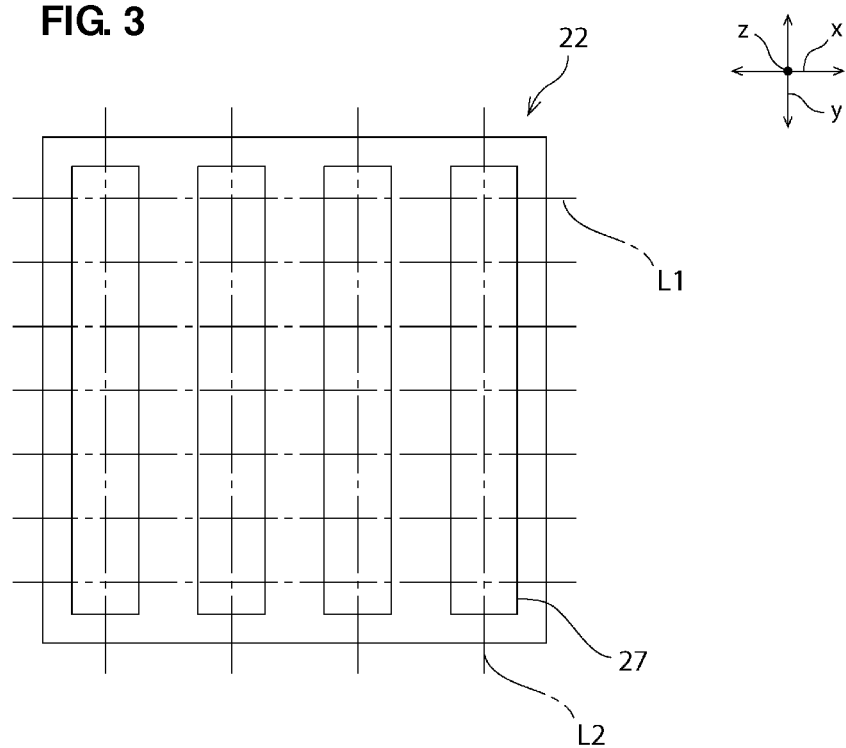
FIG. 3 is a schematic plan view of a mother laminate according to a preferred embodiment of the present invention.
Figure 4:
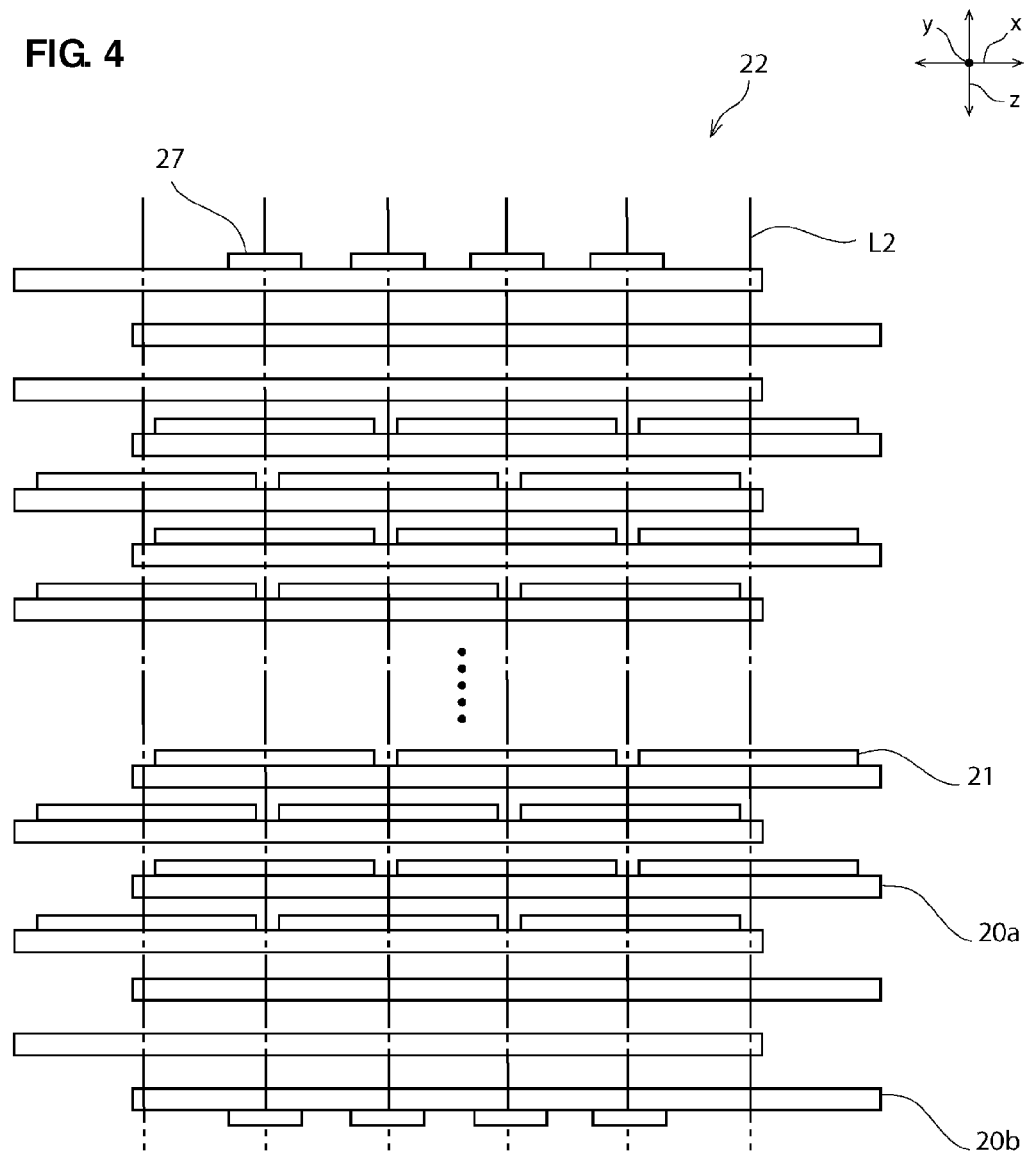
FIG. 4 is a schematic exploded side view of a mother laminate according to a preferred embodiment of the present invention.
Figure 5:
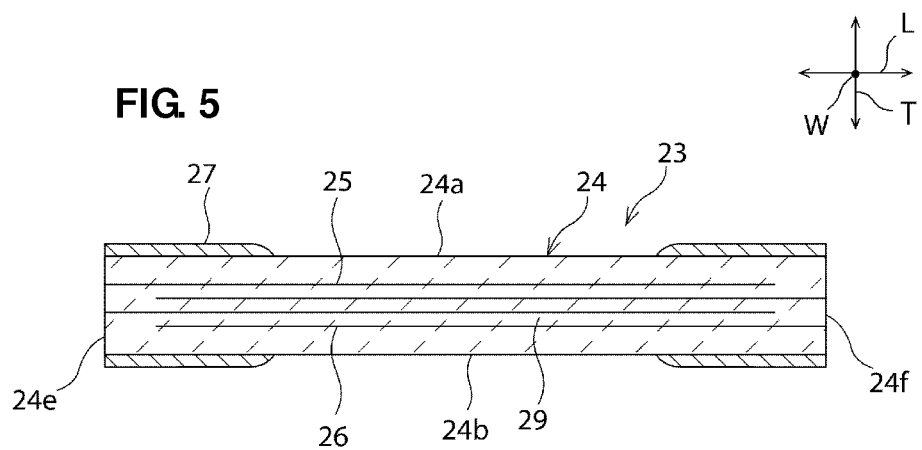
FIG. 5 is a schematic sectional view of a green ceramic element body according to a preferred embodiment of the present invention.
Figure 6:
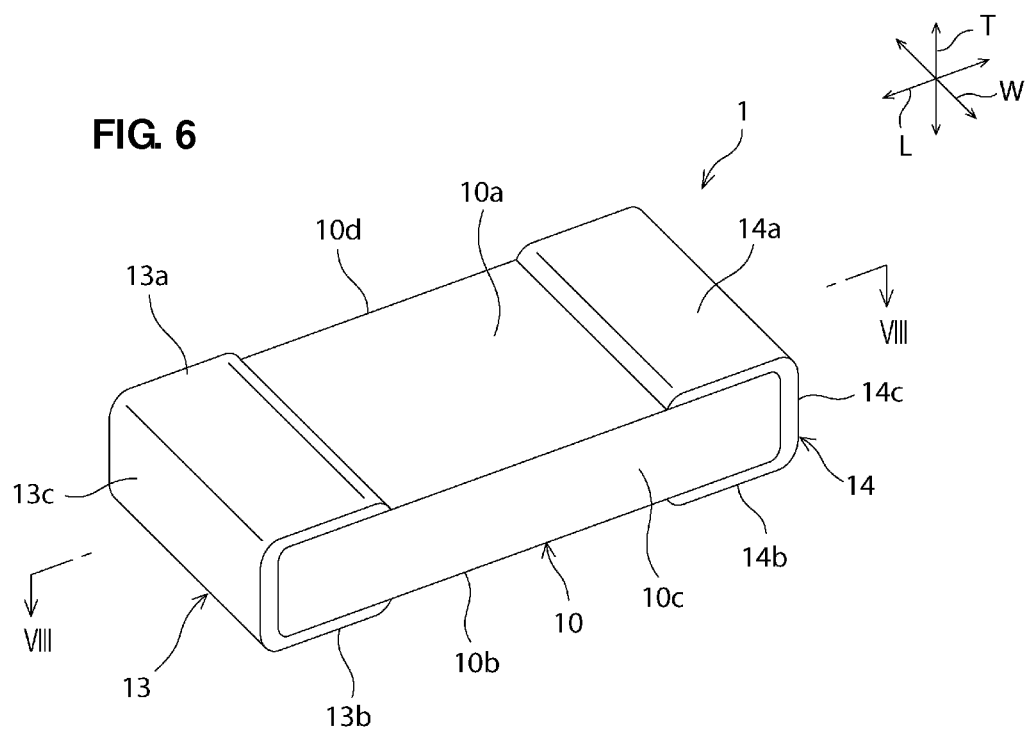
FIG. 6 is a schematic perspective view of a ceramic electronic component according to a preferred embodiment of the present invention.

FIG. 1 is a schematic plan view of a ceramic green sheet having conductive layers formed on a surface thereof according to a preferred embodiment of the present invention. FIG. 2 is a schematic plan view of a ceramic green sheet not having conductive layers formed on a surface thereof according to a preferred embodiment of the present invention. FIG. 3 is a schematic plan view of a mother laminate according to a preferred embodiment of the present invention. FIG. 4 is a schematic exploded side view of a mother laminate according to a preferred embodiment of the present invention. FIG. 5 is a schematic sectional view of a green ceramic element body according to a preferred embodiment of the present invention. FIG. 6 is a schematic perspective view of a ceramic electronic component according to a preferred embodiment of the present invention. An example of a method for manufacturing a ceramic electronic component 1 shown in FIG. 6 is described below with reference to FIGS. 1 to 5.

First, first and second ceramic green sheets 20a and 20b shown in FIGS. 1 and 2, respectively, are prepared. Each of the first and second ceramic green sheets 20a and 20b can be formed by, for example, forming ceramic slurry into a sheet and then drying the sheet.

The type of a ceramic powder used for the first and second ceramic green sheets 20a and 20b can be appropriately selected according to the characteristics of the multilayer ceramic electronic component 1 to be manufactured.

For example, when the multilayer ceramic electronic component 1 is a capacitor, a dielectric ceramic may preferably be used as the ceramic powder. Examples of the dielectric ceramic include $BaTiO_3$, $CaTiO_3$, $SrTiO_3$, $CaZrO_3$, and the like.

For example, when the multilayer ceramic electronic component 1 is a piezoelectric component, a piezoelectric ceramic may preferably be used as the ceramic powder. Examples of the piezoelectric ceramic include PZT (lead zirconate titanate) ceramics and the like.

For example, when the multilayer ceramic electronic component 1 is a thermistor, a semiconductor ceramic may preferably be used as the ceramic powder. Examples of the semiconductor ceramic include spinel-type ceramics and the like.

For example, when the multilayer ceramic electronic component 1 is an inductor, a magnetic ceramic may preferably be used as the ceramic powder. Examples of the magnetic ceramic include ferrite ceramics and the like.

The ceramic powder used for the first ceramic green sheet 20a contains a first organic binder and a first plasticizer besides the above-described ceramic powder. In addition, the ceramic powder used for the second ceramic green sheet 20b contains a second organic binder and a second plasticizer besides the above-described ceramic powder.

Specific examples of the first and second organic binders include polyvinyl butyral resins, polyvinyl formal resins, polyvinyl acetoacetal resins, polyvinyl hexanal resins, and the like. Among these, the polyvinyl butyral resins are preferably used as the first and second organic binders. As the first and second organic binders, only one organic binder or a mixture of two or more organic binders may be used. In addition, the first and second organic binders may be the same or different from each other.

Each of the first and second organic binders used preferably has a polymerization degree of about 850 to about 1700 and more preferably about 850 to about 1300, for example.

For example, a phthalate can be used as the first and second plasticizers. Examples of the phthalate include dioctyl phthalate, dimethyl phthalate, diethyl phthalate, dibutyl phthalate, bis(2-ethylhexyl) phthalate, di-normal-octyl phthalate, di-isononyl phthalate, dinonyl phthalate, di-isodecyl phthalate, butylbenzyl phthalate, and the like. Among these, dioctyl phthalate can be preferably used as the first plasticizer. As the first and second plasticizers, only one plasticizer or a mixture of two or more plasticizers may be used. In addition, the first and second plasticizers may be the same or different from each other.

The thickness of each of the first and second ceramic green sheets 20a and 20b may be about 0.5 μm to about 10 μm (after firing). The thicknesses of the first and second ceramic green sheets 20a and 20b may be the same or different from each other.

The second organic binder and the second plasticizer are used so as to satisfy the relationship $180.56 \leq A/B$ wherein A is the polymerization degree of the second organic binder, and B is the volume content of the second plasticizer.

In addition, the first and second organic binders and the first and second plasticizers are preferably used so as to satisfy the relationship $2.74 \leq ((A/B)/(A1/B1)) \leq 5.00$ wherein A1 is the polymerization degree of the first organic binder, and B1 is the volume content of the first plasticizer.

As shown in FIG. 1, conductive layers 21 are formed on the ceramic green sheet 20a by applying a first conductive paste. Specifically, a plurality of substantially rectangular conductive layers 21 for forming internal electrodes are formed in a matrix pattern on a surface of the first ceramic green sheet 20a so as to be spaced from each other along a x direction and a y direction perpendicular to the x direction. Consequently, the first ceramic green sheet 20a is prepared, in which the substantially rectangular conductive layers 21 for forming internal electrodes are arranged in a matrix pattern on a surface thereof to be spaced from each other along the x direction and the y direction perpendicular to the x direction.

Next, as shown in FIG. 4, a plurality of the ceramic green sheets 20b not each having the conductive layers 21 formed on a surface thereof are laminated. Then, as shown in FIG. 4, a plurality of the ceramic green sheets 20a each having the conductive layers 21 formed on a surface thereof are laminated. Then, as shown in FIG. 4, a plurality of the ceramic green sheets 20b not each having the conductive layers 21 formed on a surface thereof are further laminated. As a result, a mother laminate 22 containing the conductive layers 21 is formed.

If required, the mother laminate 22 may be pressed.

Next, as shown in FIG. 3, conductive paste layers 27 are formed on the mother laminate 22 by a proper printing method such as a screen printing method so as to have shapes corresponding to first and second portions 13a, 13b and 14a, 14b of first and second external electrodes 13 and 14, respectively.

Next, the mother laminate 22 is cut along the x direction and the y direction to form a green ceramic element body 23 from the mother laminate 22. Specifically, the mother laminate 22 is cut at the centers of the conductive layers 21 in the y direction (second direction) along a plurality of cut lines L1 (refer to FIG. 3) extending along the x direction (first direction). Also, the mother laminate 22 is cut at the centers of the conductive layers 21 in the x direction along a plurality of cut lines L2 extending along the y direction. Consequently, the mother laminate 22 is divided into a plurality of green ceramic element bodies 23.

The mother laminate 22 can be cut by, for example, a method such as push cutting by pushing a cutting edge, dicing, laser cutting, or the like.

As shown in FIG. 5, each of the green ceramic element bodies 23 preferably has a substantially rectangular parallelepiped-shaped chip body 24 including a pair of main surfaces 24a and 24b, a pair of side surfaces (not shown), and a pair of end surfaces 24e and 24f. The main surfaces 24a and 24b extend along the length direction L and the width direction W. The side surfaces extend along the length direction L and the thickness direction T. The end surfaces 24e and 24f extend along the width direction W and the thickness direction T.

In addition, a plurality of substantially rectangular first and second internal electrodes 25 and 26 which are formed from the conductive layers 21 are disposed in the chip body 24. The plurality of the first internal electrodes 25 and the plurality of the second internal electrodes 26 are alternately disposed at distances therebetween along the thickness direction T. The first and second internal electrodes 25 and 26 adjacent in the thickness direction T face each other with a ceramic layer 29 disposed therebetween.

The first and second internal electrodes 25 and 26 are disposed along the length direction L and the width direction W. The first internal electrodes 25 are exposed in the end surface 24e but not exposed in the end surface 24f. The second internal electrodes 26 are exposed in the end surface 24f but not exposed in the end surface 24e. That is, the first internal electrodes 25 are exposed in the end surface 24e, while the second internal electrodes 26 are not exposed in the end surface 24e. The second internal electrodes 26 are exposed in the end surface 24f, while the first internal electrodes 25 are not exposed in the end surface 24f.

Next, a conductive paste is applied to the end surfaces 24e and 24f of the green ceramic element body 23 by a proper method such as a dipping method to form conductive paste layers having shapes corresponding to third portions 13c and 14c of the first and second external electrodes 13 and 14, respectively. These conductive paste layers and the above-described conductive paste layers 27 constitute conductive paste layers for forming the external electrodes 13 and 14 which extend from the end surfaces 24e and 24f to the main surfaces 24a and 24b, respectively.

The conductive paste includes a proper conductive material and a solvent. As the conductive material, for example, a metal selected from the group consisting of Ni, Cu, Ag, Pd, and Au, or an alloy (e.g., an Ag—Pd alloy) containing at least one metal selected from the group consisting of Ni, Cu, Ag, Pd, and Au may preferably be used, for example. As the solvent, for example, terpineol, dihydroterpineol, dihydroterpinyl acetate, or the like may preferably be used, for example.

Further, the green ceramic element body 23 is preferably rounded at the ridges and the corners by barreling or the like.

Next, the green ceramic element body 23 is fired to produce a ceramic element body 10. The firing temperature preferably is, for example, about 900° C. to about 1300° C. In the firing step, the first and second external electrodes 13 and 14 and the first and second internal electrodes 25 and 26 preferably are simultaneously fired.

Figure 7:
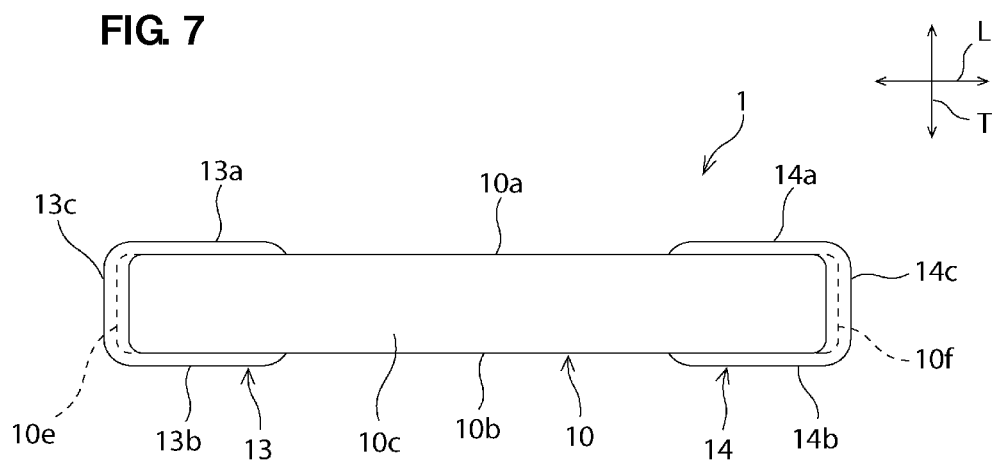
FIG. 7 is a schematic side view of a ceramic electronic component according to a preferred embodiment of the present invention.

FIG. 6 is a schematic perspective view of the multilayer ceramic electronic component manufactured according to a preferred embodiment of the present invention. FIG. 7 is a schematic side view of the ceramic electronic component according to a preferred embodiment of the present invention.

Figure 8:
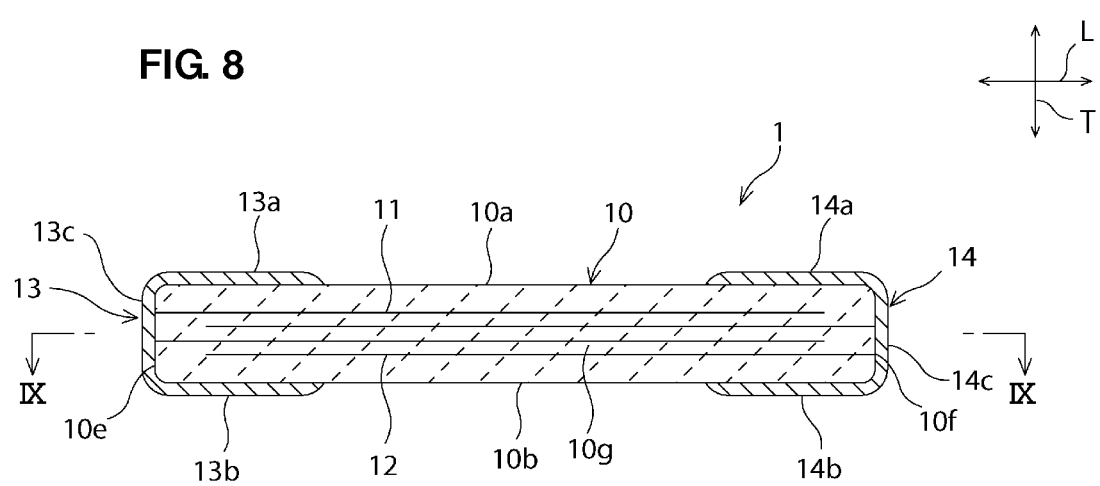
FIG. 8 is a schematic sectional view taken along line VIII-VIII in FIG. 6.
Figure 9:
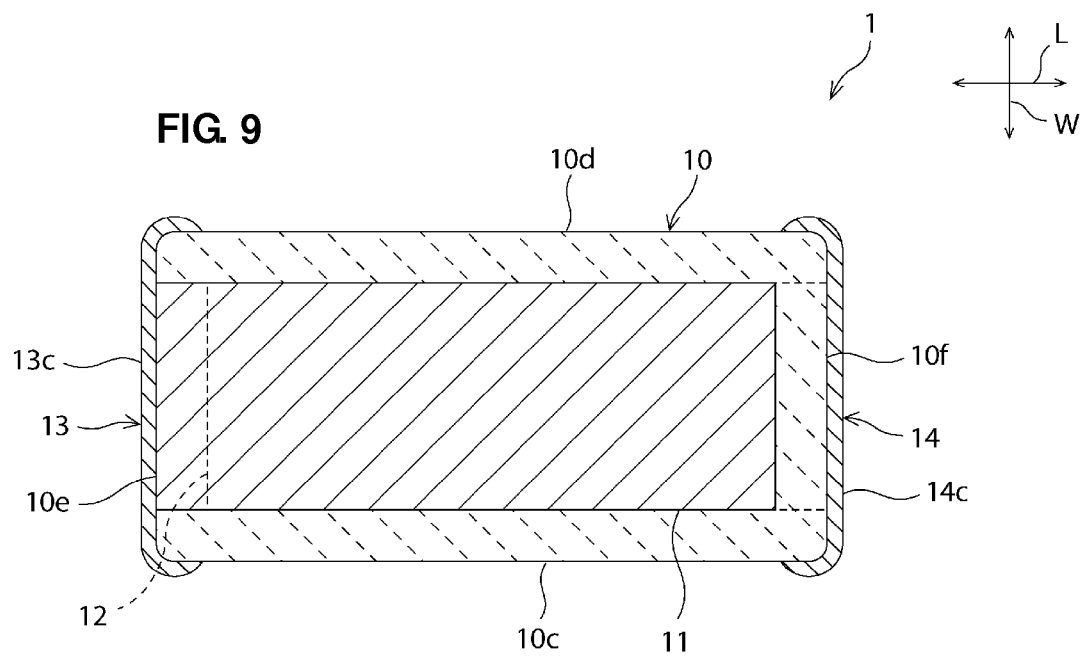
FIG. 9 is a schematic sectional view taken along line IX-IX in FIG. 8.

FIG. 8 is a schematic sectional view taken along line VIII-VIII in FIG. 6. FIG. 9 is a schematic sectional view taken along line IX-IX in FIG. 8.

As shown in FIGS. 6 to 9, the multilayer ceramic electronic component 1 preferably includes a substantially rectangular parallelepiped-shaped ceramic element body 10. The ceramic element body 10 includes first and second main surfaces 10a and 10b extending along the length direction L and the width direction W, first and second side surfaces 10c and 10d extending along the thickness direction T and the length direction L, and first and second end surfaces 10e and 10f extending along the thickness direction T and the width direction W.

In the present invention, the "substantially rectangular parallelepiped" includes a substantially rectangular parallelepiped with rounded corners and ridges. That is, a "substantially rectangular parallelepiped" member represents a general member including first and second main surfaces, first and second side surfaces, and first and second end surfaces. In addition, projections and depressions may be formed in part or all of the main surfaces, the side surfaces, and the end surfaces.

The dimensions of the ceramic element body 10 are not particularly limited. The ceramic element body 10 preferably has a thin shape satisfying $T \leq W < L$, $\frac{1}{5}W \leq T \leq \frac{1}{2}W$, and $T \leq$ about 0.3 mm, for example, wherein T is the thickness dimension, L is the length dimension, and W is the width dimension. Specifically, it is preferred that the following relationships are satisfied: about 0.1 mm $\leq T \leq$ about 0.3 mm, about 0.4 mm $\leq L \leq$ about 1 mm, and about 0.2 mm $\leq W \leq$ about 0.5 mm, for example.

As shown in FIG. 8, in the ceramic element body 10, a plurality of first and second substantially rectangular internal electrodes 11 and 12 are alternately disposed at equal distances therebetween along the thickness direction T. The first and second internal electrodes 11 and 12 are parallel or substantially parallel with the first and second main surfaces 10a and 10b, respectively. The first and second internal electrodes 11 and 12 face each other with a ceramic layer 10g disposed therebetween along the thickness direction T.

As shown in FIGS. 6 to 9, the multilayer ceramic electronic component 1 includes the first and second external electrodes 13 and 14. As shown in FIG. 8, the first external electrode 13 is connected to the first internal electrodes 11, while the second external electrode 14 is connected to the second internal electrodes 12.

The first and second external electrodes 13 and 14 include first and second portions 13a, 13b and 14a, 14b on the first and second main surfaces 10a and 10b, and third portions 13c and 14c on the first and second end surfaces 10e and 10f, respectively. The first and second external electrodes 13 and 14 can be made of a proper conductive material. Also, the first and second external electrodes 13 and 14 may be made of a laminate including a plurality of conductive films.

As described above, when a conductive paste is applied to a surface of a green ceramic element body in the process for manufacturing a multilayer ceramic electronic component, a solvent contained in the conductive paste penetrates into the green ceramic element body, thereby causing the problem of swelling or distorting the green ceramic element body.

In contrast, in the method for manufacturing the multilayer ceramic electronic component 1 according to a preferred embodiment of the present invention, as shown in FIGS. 3 to 5, the second ceramic green sheet 20b is disposed in a portion where the conductive paste is applied to each of the main surfaces 24a and 24b of the green ceramic element body 23. In this preferred embodiment, the second organic binder and the second plasticizer contained in the second ceramic green sheet 20b preferably satisfy the relationship $180.56 \leq A/B$ wherein A is the polymerization degree of the second organic binder contained in the second ceramic green sheet 20b, and B is the volume content of the second plasticizer contained in the second ceramic green sheet 20b. As a result, bonding of the second ceramic green sheet 20b is enhanced, and thus the formed second ceramic green sheet 20b is made hard, thereby significantly reducing and preventing penetration of the solvent or the like contained in the conductive paste into the green ceramic element body 23 when the conductive paste is applied to a surface of the green ceramic element body 23. Therefore, the method for manufacturing the multilayer ceramic electronic component 1 according to the present preferred embodiment of the present invention effectively reduces and prevents swelling or distortion of the green ceramic element body 23.

In addition, swelling of the green ceramic element body may cause a void due to delamination or the like in the multilayer ceramic electronic component. In the case of a thin-shaped multilayer ceramic electronic component, the inner void significantly affects the characteristics of the multilayer ceramic electronic component.

In the method for manufacturing the multilayer ceramic electronic component 1 according to a preferred embodiment of the present invention, the relationship $2.74 \leq ((A/B)/(A1/B1)) \leq 5.00$ preferably is further satisfied, wherein A1 is the polymerization degree of the first organic binder contained in the first ceramic green sheets, B1 is the volume content of the first plasticizer contained in the first ceramic green sheets, A is the polymerization degree of the second organic binder contained in the second ceramic green sheet, and B is the volume content of the second plasticizer contained in the second ceramic green sheet. In this case, swelling or distortion of the green ceramic electronic component 23 is effectively prevented and, in addition to this, the occurrence of an inner void can be effectively prevented in the multilayer ceramic electronic component 1. This is considered to be due to the fact that each of the first and second ceramic green sheets is adjusted to proper hardness, thereby significantly reducing and preventing a shrinkage difference between the first and second ceramic green sheets.

In a preferred embodiment of the present invention, an example is described, in which $180.56 \leq A/B$ is satisfied in each of the plurality of the second ceramic green sheets. However, the present invention is not limited to this configuration. For example, $180.56 \leq A/B$ may be satisfied in only the second ceramic green sheets disposed in the outermost layers constituting the main surfaces. In this case, the same effect can be achieved.

Similarly, $2.74 \leq ((A/B)/(A1/B1)) \leq 5.00$ is preferably satisfied in each of the plurality of the second ceramic green sheets. However, $2.74 \leq ((A/B)/(A1/B1)) \leq 5.00$ may be satisfied in only the second ceramic green sheets disposed in the outermost layers constituting the main surfaces.

In addition, a conductive layer not constituting an internal electrode may be provided on each of the second ceramic green sheets. For example, a conductive layer may be provided on each of the second ceramic green sheets in order to form a dummy electrode. For example, in the case of a capacitor, the internal electrode is an electrode which forms a capacity and, in general, the internal electrode is an electrode that exhibits the function of an electronic component.

The present invention is described in further detail below on the basis of non-limiting examples. However, the present invention is not limited to these examples and can be carried out with appropriate changes within the scope of the gist of the present invention.

EXAMPLE 1

The mother laminate of the multilayer ceramic electronic component 1 according to a preferred embodiment of the present invention was formed by the method described in the embodiment under conditions described below.

(1) First Ceramic Green Sheet 20a
  Ceramic powder: $BaTiO_3$ about 79.3% by volume
  First organic binder: polyvinyl butyral resin (polymerization degree 850) about 10.2% by volume
  First plasticizer: dioctyl phthalate about 17.0% by volume
  Composition of conductive layer 21: conductive material Ni, solvent terpineol
  Size of first ceramic green sheet 20a: about 200 mm×about 200 mm
  Number of first ceramic green sheets 20a laminated: about 7

(2) Second Ceramic Green Sheet 20b
  Ceramic powder: $BaTiO_3$ about 79.3% by volume
  Second organic binder: polyvinyl butyral resin (polymerization degree 1300) about 22.0% by volume
  Second plasticizer: dioctyl phthalate about 5.2% by volume
  Size of second ceramic green sheet 20b: about 200 mm×about 200 mm
  Number of second ceramic green sheets 20b laminated: about 7

(3) Composition of Conductive Paste Layer 27: Conductive Material Ni, Solvent Terpineol As shown in Table 1 below, the organic binder and the plasticizer in each of the ceramic green sheets of examples and comparative examples were adjusted so that the total amount was about 27.2% by volume.

The mother laminate 22 produced in Example 1 was cut so that the size of the ceramic element body 23 after firing was about 1.0 mm×about 0.5 mm×about 0.15 mm. The presence of swelling or distortion in the green ceramic element body 23 was confirmed with NEXIV VMR-6555 manufactured by Nikon Instech Co., Ltd. Specifically, after the mother laminate 22 was cut, the mother laminate 22 was equally partitioned into about 100 regions in a plan view before being divided into individual green ceramic element bodies 23. Among a plurality of green ceramic element bodies 23 present in each of the regions, one green ceramic element body 23 positioned at the center of each region was confirmed with respect to the presence of swelling or distortion in the width direction X of a portion where the conductive paste layer 27 was applied. Based on the dimensional standards of the green ceramic element bodies 23, when the width-direction length of a portion applied with the conductive paste layer 27 was less than a predetermined length, it was determined that swelling or distortion occurred. Table 1 shows the number of the regions each containing the green ceramic element body with swelling or distortion in the 100 regions. Table 1 indicates that substantially neither swelling nor distortion occurred in the green ceramic element bodies produced in Example 1.

EXAMPLES 2 TO 8 AND COMPARATIVE EXAMPLES 1 AND 2

A mother laminate 22 of each of Examples 2 to 8 and Comparative Examples 1 and 2 was produced by the same method as in Example 1 using the types (polymerization degrees) and amounts of first and second organic binders and the amounts of first and second plasticizers shown in Table 1. Next, the mother laminate 22 produced in each of Examples 2 to 8 and Comparative Examples 1 and 2 was confirmed with respect to swelling or distortion by the same method as in Example 1. The results are shown in Table 1. Table 1 indicates that substantially neither swelling nor distortion occurred in the green ceramic element bodies 23 produced in Examples 2 to 8. On the other hand, much swelling or distortion occurred in the green ceramic element bodies produced in Comparative Examples 1 and 2.

Next, all the green ceramic element bodies 23 produced from the mother laminate 22 of each of Examples 1 to 8 and Comparative Examples 1 and 2 were fired at 1200° C. for 2 hours in an inert gas atmosphere. All of the ceramic laminates were confirmed with respect to the presence of an internal void using an ultrasonic microscope (C-SAM). As a result, an internal void did not occur in any one of the ceramic laminates produced in Examples 2 to 5.

TABLE 1

|  | First ceramic green sheet | | | Second ceramic green sheet | | | | | Number of regions where swelling or distortion occurred |
| --- | --- | --- | --- | --- | --- | --- | --- | --- | --- |
|  | Polymerization degree A1 of first organic binder | Amount of first organic binder (% by volume) | Amount B1 of first plasticizer (% by volume) | Polymerization degree A of second organic binder | Amount of second organic binder (% by volume) | Amount B of second plasticizer (% by volume) | A/B | (A/B)/(A1/B1) |  |
| Example 1 | 850 | 10.2 | 17.0 | 1300 | 23.0 | 4.2 | 309.52 | 6.19 | 1/100 |
| Example 2 | 850 | 10.2 | 17.0 | 1300 | 22.0 | 5.2 | 250.00 | 5.00 | 1/100 |
| Example 3 | 850 | 10.2 | 17.0 | 1300 | 21.0 | 6.2 | 209.68 | 4.19 | 1/100 |
| Example 4 | 850 | 10.2 | 17.0 | 1300 | 20.0 | 7.2 | 180.56 | 3.61 | 4/100 |
| Comparative Example 1 | 850 | 10.2 | 17.0 | 1300 | 10.2 | 17.0 | 76.47 | 1.53 | 10/100 |
| Comparative Example 2 | 850 | 10.2 | 17.0 | 1300 | 8.0 | 19.2 | 67.71 | 1.35 | 10/100 |
| Example 5 | 1300 | 10.2 | 17.0 | 1300 | 21.0 | 6.2 | 209.68 | 2.74 | 1/100 |
| Example 6 | 1300 | 20.0 | 7.2 | 1300 | 20.0 | 7.2 | 180.56 | 1.00 | 4/100 |
| Example 7 | 1300 | 21.0 | 6.2 | 1300 | 21.0 | 6.2 | 209.68 | 1.00 | 1/100 |
| Example 8 | 1300 | 22.0 | 5.2 | 1300 | 22.0 | 5.2 | 250.00 | 1.00 | 1/100 |

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for manufacturing a multilayer ceramic electronic component comprising:
   a step of preparing at least one first ceramic green sheet with a conductive layer being formed on a surface thereof in order to form an internal electrode, and at least one second ceramic green sheet with no conductive layer being formed on a surface thereof in order to form an internal electrode;
   a step of laminating the at least one first ceramic green sheet and the at least one second ceramic green sheet on each other to form a green ceramic element body including a main surface and an end surface at which the conductive layer is exposed;
   a step of applying a conductive paste to the main surface to form a conductive paste layer to form an external electrode; and
   a step of firing the green ceramic element body to provide a multilayer ceramic electronic component; wherein
   each of the at least one first ceramic green sheet and the at least one second ceramic green sheet contains an organic binder and a plasticizer;
   the at least one second ceramic green sheet satisfies $180.56 \leq A/B$ wherein A is a polymerization degree of the organic binder, and B is a volume content of the plasticizer; and
   in the step of laminating the at least one first ceramic green sheet and the at least one second ceramic green sheet on each other to form the green ceramic element body, a plurality of the second ceramic green sheets, a plurality of the first ceramic green sheets, and a plurality of the second ceramic green sheets are laminated in this order, and each of the plurality of the second ceramic green sheets satisfies $2.74 \leq ((A/B)/(A1/B1)) \leq 5.00$, where A1 is a polymerization degree of the organic binder contained in the plurality of the first ceramic green sheets, and B1 is a volume content of the plasticizer contained in the plurality of the first ceramic green sheet.

2. The method for manufacturing a multilayer ceramic electronic component according to claim 1, wherein the organic binder contained in each of the first and second ceramic green sheets includes at least one resin selected from the group consisting of polyvinyl butyral resins, polyvinyl formal resins, and polyvinyl hexanal resins.

3. The method for manufacturing a multilayer ceramic electronic component according to claim 1, wherein the plasticizer contained in each of the first and second ceramic green sheets is a phthalate.

4. The method for manufacturing a multilayer ceramic electronic component according to claim 1, wherein the multilayer ceramic electronic component is a capacitor and the first and second ceramic green sheets are made of a dielectric ceramic.

5. The method for manufacturing a multilayer ceramic electronic component according to claim 1, wherein the multilayer ceramic electronic component is a piezoelectric component and the first and second ceramic green sheets are made of a piezoelectric ceramic.

6. The method for manufacturing a multilayer ceramic electronic component according to claim 1, wherein the multilayer ceramic electronic component is a thermistor and the first and second ceramic green sheets are made of a semiconductor ceramic.

7. The method for manufacturing a multilayer ceramic electronic component according to claim 1, wherein the multilayer ceramic electronic component is an inductor and the first and second ceramic green sheets are made of a magnetic ceramic.

* * * * *